United States Patent [19]

Sluga et al.

[11] Patent Number: 5,106,425
[45] Date of Patent: Apr. 21, 1992

[54] METHOD FOR MAINTAINING A FLAMMABLE SOLVENT IN A NON-FLAMMABLE ENVIRONMENT

[75] Inventors: Robert M. Sluga, Gurnee; Randolph H. Watkins, Wonder Lake; Jerry D. Fisher, McHenry; Dennis C. Berry, Woodstock; Milo Eldridge, Ringwood, all of Ill.

[73] Assignee: Baxter International, Inc., Deerfield, Ill.

[21] Appl. No.: 659,800

[22] Filed: Feb. 22, 1991

Related U.S. Application Data

[62] Division of Ser. No. 601,229, Oct. 22, 1990.

[51] Int. Cl.$^5$ .............................................. B08B 5/00
[52] U.S. Cl. ..................................... 134/10; 134/11; 134/12; 134/31; 202/170; 203/DIG. 16
[58] Field of Search ............... 134/11, 26, 27, 30, 134/31, 42, 10, 12; 422/41, 42; 202/170, 156, 155; 203/99, DIG. 16; 210/640, 188

[56] References Cited

U.S. PATENT DOCUMENTS

| | | | |
|---|---|---|---|
| 3,881,949 | 5/1975 | Brock | 134/31 |
| 3,904,102 | 9/1975 | Chu et al. | 228/180 |
| 3,904,430 | 9/1975 | Tipping et al. | 134/11 |
| 3,957,531 | 5/1976 | Tipping et al. | 134/11 |
| 4,014,751 | 3/1977 | McCord | 202/160 |
| 4,023,983 | 5/1977 | Houke et al. | 134/11 |
| 4,032,033 | 6/1977 | Chu et al. | 134/11 |
| 4,077,467 | 3/1978 | Spigarelli | 165/105 |

Primary Examiner—Theodore Morris
Assistant Examiner—Saeed Chaudhry
Attorney, Agent, or Firm—Foley & Lardner

[57] ABSTRACT

A method for maintaining a flammable solvent in a nonflammable environment involves covering the flammable solvent with a nonflammable vapor blanket provided by a nonflammable solvent, such that vapors from the flammable and nonflammable solvents form a nonflammable gaseous mixture in the blanket. Such a method is used in removal of both oil-based and polar contaminants to control the flammability potential of an alcohol solvent. An apparatus for cleaning articles using fluorocarbon and alcohol solvents includes a chamber having a plurality of compartments for containing the solvents and a bounded vapor space. At least one of the compartments contains liquid fluorocarbon and at least one other will contain liquid alcohol. The solvents voltalize into the bounded vapor space to provide a nonflammable vapor blanket over the alcohol-containing compartment. Volatilized alcohol is mixed with the volatilized fluorocarbon to form a nonflammable mixture which is purified and separated, and the recovered fluorocarbon can be reused in subsequent cleaning operations.

19 Claims, 3 Drawing Sheets

METHOD FOR MAINTAINING A FLAMMABLE SOLVENT IN A NON-FLAMMABLE ENVIRONMENT

This is a division of application Ser. No. 07/601,229, filed Oct. 22, 1990.

TECHNICAL FIELD

The present invention relates generally to solvent systems utilizing flammable solvents, particularly solvent systems for removing contaminants from the surfaces of articles. The invention also relates to a method and apparatus particularly well suited for use of chlorofluorocarbons as cleaning solvents in which substitutes are less efficient.

BACKGROUND OF THE INVENTION

In many industrial and medical applications, virtually complete removal of contaminants from the surfaces of articles or devices is essential. Particularly acute are the cleaning requirements for medical devices used in a wide array of medical procedures, and for electrical or electronic assemblies in which metal/plastic combinations pose numerous cleaning problems and cleaning agents must penetrate the microscopic crevices of electronic chips. It is with particular reference to such endeavors that the ensuing description will be made; however, it will be appreciated by those skilled in the art that similar problems of contaminant removal can arise in myriad other applications.

The use of chlorofluorocarbons (CFC's) as solvents, cleaning agents or degreasing agents is common in industry for the removal of oil, grease, and related contaminants from articles and materials. These solvents have been generally favored because they are easily volatilized, are inert to chemical reaction with most materials, are colorless, virtually odorless, nonflammable, noncorrosive, highly stable and have low toxicity compared to alternatives.

Despite the many advantages of chlorofluorocarbons as solvents, they are not well suited for removing some types of contaminants, such as resins and polar compounds. Other solvents are generally required for these substances. The lower aliphatic alcohols, such as methanol, ethanol and isopropanol, have long been used for cleaning and removing resins and polar substances. Their excellent cleaning properties have even led to military specifications whereby alcohols are used to assess the cleaning properties of other liquids. Use of alcohols, however, poses high flammability and explosion risk. Specially built and maintained facilities are required to reduce the chance of fire or explosion. Flame, spark and explosion proofing (for example, the use of bronze motors) is extremely costly, making it difficult to utilize alcohols by inexpensive means.

To overcome the risks and expense associated with use of alcohols, yet provide a system for removal of both oil-based and polar contaminants, special nonflammable solvent blends have been formulated. For example, such blends are commercially available as TP-35 (35% isopropanol in trichlorotrifluoroethanes) and Freon TP (6-8% isopropanol in trichlorotrifluoroethanes) manufactured by E.I. Du Pont de Nemours & Company, Wilmington, Del.; and are described in U.S. Pat. No. 3,789,004 issued Jan. 29, 1974 to McMillan et al. (94% 1,1,2-trichloro-1,2,2-trifluoroethane, 3% ethanol and 3% acetonitrile); and U.S. Pat. No. 4,745,690 issued May 24, 1988 to Koop et al. (fluorocarbon, such as 1,1,2-trichloro -1,2,2-trifluoroethane, and alcohols, such as isopropanol, methanol, ethanol and butanol). These formulations are reportedly nonflammable and generally stable liquids, but are limited in the percentage of total alcohol in the solution. If a higher percentage of alcohol is required to remove a specific contaminant, such solvent blends are not efficient cleaners.

Other cleaning systems have been described which either improve or extend the use of chlorofluorocarbons to remove certain types of contaminants, or reduce the flammability risk of using alcohols. A multisolvent-compartment system in which one compartment contains a chlorofluorocarbon with a surfactant is one such approach. In this system, articles to be cleaned are first subjected to an aqueous cleaning and are then immersed in chlorofluorocarbon compartments, one of which contains chlorofluorocarbon with the surfactant to remove water. It is reported that the addition of surfactant to the chlorofluorocarbon ensures removal of traces of water by solubilization. (See, Banks, *Organofluorine Chemicals and Their Industrial Applications*, Ellis Horwood Ltd., West Sussex, England, 1979, p. 70, citing British Standard Specification BS4849).

An approach which limits the flammability risk of alcohols as cleaning agents is described in "Alcohol Cleaning under a Nonflammable Perfluorocarbon Vapour Blanket" by Slinn and Baxter, *Proceedings of the Technical Program*, Nepcon West '90, Feb. 26-Mar. 1, 1990. This system basically consists of floating a less dense alcohol layer, such as isopropanol, on a more dense boiling perfluorocarbon layer. The vapor above the liquids is a mixture of the perfluorocarbon and isopropanol and is nonflammable. Two sets of cooling coils are utilized in the vapor space above the liquids, one to recover the alcohol and a second for the perfluorocarbon. Although this system has the advantage of using a perfluorocarbon which has an apparently comparatively negligible ozone-depletion potential, it has drawbacks with regard to the cleaning operation. For example, the temperature of the liquid alcohol is limited by the boiling temperature of the perfluorocarbon, which will be well below the boiling temperature of the alcohol, thus eliminating cleaning situations which may require high temperatures.

Despite attempts to provide simple, nonflammable, nonexplosive, low toxicity, cost efficient methods of removing a full spectrum of contaminants from grease- and oil-based to polar, the art has not responded with the introduction of a system having features that adequately address these considerations.

SUMMARY OF THE INVENTION

A method for maintaining a flammable solvent in a nonflammable environment according to the invention involves the flammable solvent under a nonflammable vapor blanket provided by a nonflammable solvent such that vapors from said flammable and nonflammable solvents form a nonflammable gaseous mixture in the blanket.

The invention further provides a contaminant removal apparatus and method for both oil-based and polar substances which better controls the flammability potential of alcohol solvent, emphasizes recovery of the fluorocarbon solvents, and does so in a cost efficient manner compared to other systems utilizing flammable solvent. In one preferred embodiment of the invention, an apparatus is provided for cleaning articles using fluorocarbon and alcohol, but having reduced alcohol flammability. The apparatus includes a chamber having a plurality of compartments for containing solvent and a bounded vapor space. At least one of the compartments will contain liquid fluorocarbon and at least one other will contain liquid alcohol. Each compartment is provided with a means for introducing volatilized solvent into the bounded vapor space. The liquid alcohol compartment is positioned proximate the compartment(s) containing fluorocarbon, such that the volatilized fluorocarbon provides a nonflammable vapor blanket over the alcohol-containing compartment. Volatilized alcohol is mixed with the volatilized fluorocarbon to form a nonflammable mixture which is purified and separated, and the recovered fluorocarbon is reused in subsequent cleaning operations.

In an illustrated embodiment, a fluorocarbon-alcohol system for cleaning articles and having minimized alcohol flammability includes a chamber having a solvent domain with three solvent compartments, and a vapor domain, specifically, a bounded vapor space. The first and third compartments contain liquid fluorocarbon, while the second compartment, located between them, contains liquid alcohol. Heaters with temperature controllers are provided for each compartment for generating volatilized fluorocarbon and volatilized alcohol into the bounded vapor space to form a nonflammable vapor mixture of fluorocarbon and alcohol. Two sets of condensing coils or cold traps for condensing the volatilized solvents are used, one positioned in, near or otherwise in fluid communication with the vapor space, to condense the nonflammable vapor mixture, and the other along the periphery of the second compartment for condensing volatilized alcohol and any other condensible vapors accumulated in the alcohol-containing compartment. Both condensing coils have temperature regulators, and both have accumulators for collecting and removing the condensate formed. A recycling section is provided for recovering and reusing the liquid and volatilized fluorocarbon.

An advantage of the invention is that a cleaning solvent containing a high percentage of alcohol at elevated temperatures may be used under reduced flammability conditions. Removal of many contaminants requires solvents with a high percentage of alcohol and use of such solvents usually requires costly, complex facilities and equipment. Another advantage of the invention is that use of alcohol under conditions according to the invention is simple and cost efficient.

Other advantages and a fuller appreciation of specific adaptations, compositional variations, and physical attributes will be gained upon an examination of the following detailed description of preferred embodiments, taken in conjunction with the figures of the drawing.

BRIEF DESCRIPTION OF THE DRAWINGS

The preferred exemplary embodiment of the invention will hereinafter be described in conjunction with the appended drawing, wherein like designations refer to like elements, and in which.

DETAILED DESCRIPTION

The present invention relates broadly to solvent systems for removing contaminants from the surfaces of articles. However, the system of the invention is particularly well adapted for use in removing both oil-based and polar contaminants from surfaces of articles of polymeric resins, silicon or silicon resins, ceramic, metal or glass. Such materials find application, for example, in electronic circuits, optical disks, and various medical devices such as dialyzers, catheters and implants.

The apparatus of the invention is especially well suited for use with solvent systems involving both flammable and nonflammable solvents. Typically, the flammable solvent dissolves polar substances, while the nonflammable one dissolves oil and grease-based substances. Such solvent systems are exemplified by contaminant removal utilizing fluorocarbon and alcohol, in which the fluorocarbon is nonflammable and the alcohol is flammable. Accordingly, the invention will now be described in detail with respect to such fields of endeavor; however, those skilled in the art will appreciate that such a description is meant to be exemplary only and should not be viewed as limitative on the full scope thereof.

In accordance with the invention, vapors of the nonflammable fluorocarbon solvent provide a nonflammable vapor blanket, i.e., a nonflammable gaseous atmosphere, for the flammable alcohol solvent, thus minimizing alcohol flammability. The apparatus of the invention is characterized by several attributes: use of high concentrations of alcohol under reduced flammability conditions, substantially reduced tendency for fluorocarbon and alcohol emissions, removal of both oil-based and polar contaminants in a simple sequential process, cost efficiency compared to standard alcohol washing and chlorofluorocarbon cleaning. These attributes are achieved through a particular structural arrangement meeting a special combination of physical parameters.

Figure 1:
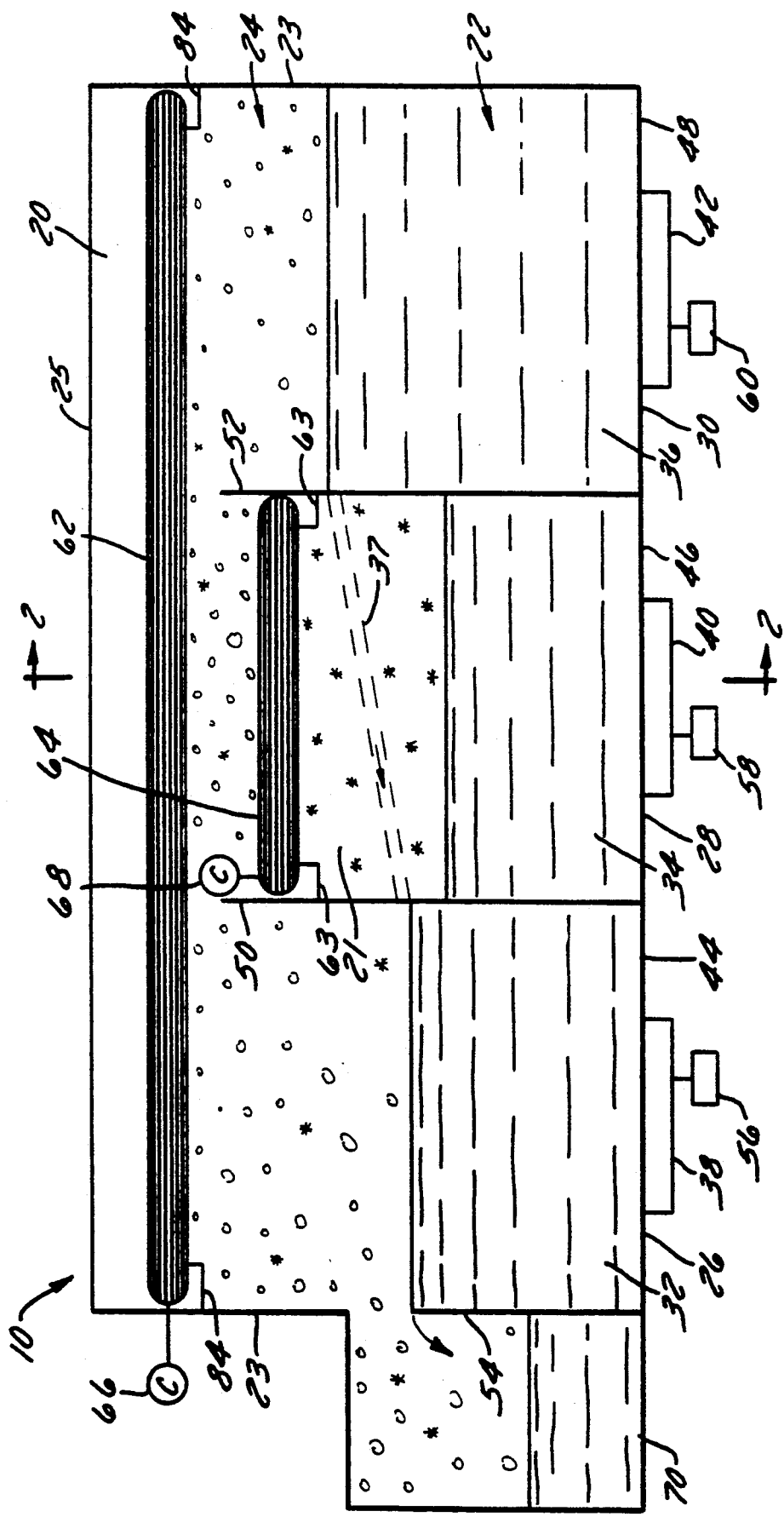
FIG. 1 is a side sectional schematic view of a cleaning chamber in accordance with the invention.
Figure 2:
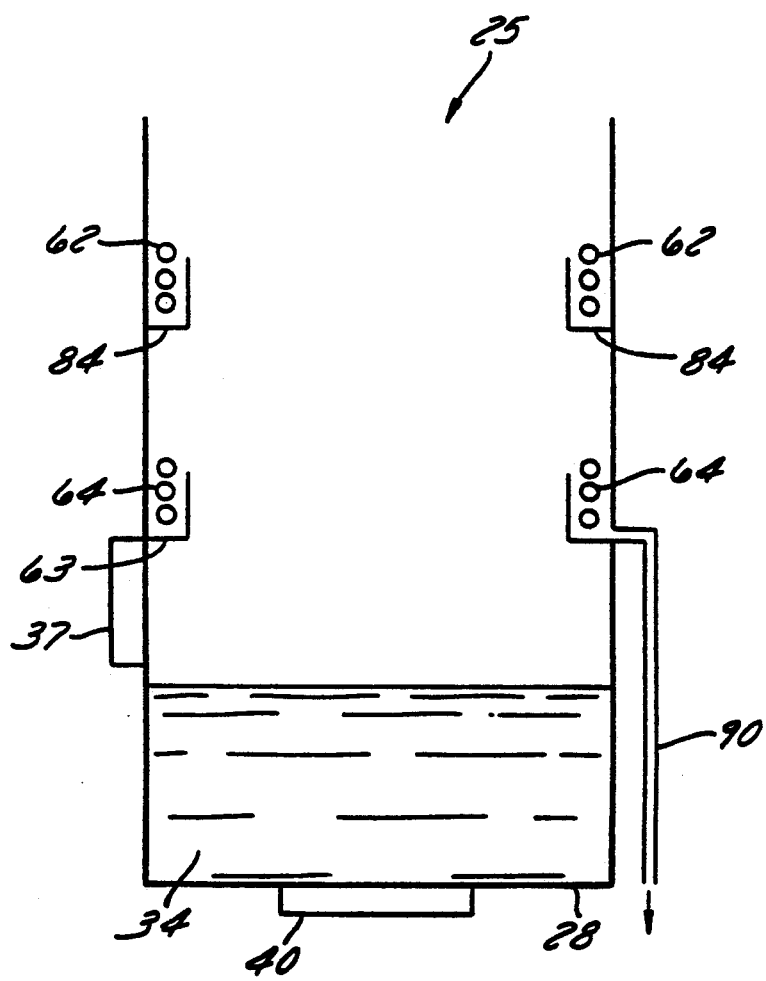
FIG. 2 is a cross-sectional view substantially along line 2—2 of FIG. 1.

In FIGS. 1 and 2 an apparatus 10 according to the invention includes an enclosure forming a chamber 20, an enclosed chamber which includes a solvent domain 22 and a vapor domain, preferably a bounded vapor space 24. Solvent domain 22 includes three compartments 26, 28, 30, contiguously arranged with respect to each other and configured to contain fluid solvents 32, 34, and 36, respectively, which are used to treat the surfaces of the articles to be cleaned. Vapor space 24 is bounded by side walls 23 and a top access opening 25 of chamber 20, and includes the space above or superior to the solvents in compartments 26, 28, and 30.

The solvents 32 and 36 contained in compartments 26 and 30 in the illustrated embodiment are a liquid fluorocarbon which becomes, during cleaning operations, a fluorocarbon-alcohol mixture having an alcohol concentration up to the azeotropic composition. The solvent in compartment 28 is an alcohol. Alternatively, the solvent in compartment 28 may be an alcohol-water solution. As discussed below, the use of an alcohol-containing compartment proximate the fluorocarbon compartments provides certain advantages not enjoyed by other compartment arrangements.

Compartments 26, 28 and 30 have partition walls 50, 52, respectively, and bottoms 44, 46, and 48, respectively, and have regulator means for controlling the temperatures of the solvents in each compartment. Regulator means are provided in the form of heaters 38, 40 and 42 which may be conveniently located at the bottoms 44, 46 and 48, respectively, of compartments 26, 28, and 30. Heaters similar to a conventional hot plate are found adequate for those purposes. Heaters 38, 40, 42 are operatively associated with temperature controllers 56, 58 and 60, respectively, so that the temperature of each solvent may be independently regulated and preselected within a desired range. The temperature controllers may be thermostats, thermocouples or any conventional temperature regulators. The heaters may be of various constructions, including hot water or electric heating coils; the heating capacity of the heaters ranges from ambient temperatures to boiling temperatures of the solvents. The temperatures of the solvents in the compartment may thus be selected in the range from ambient temperatures to boiling temperatures depending on the particular cleaning conditions required.

Fluorocarbon and alcohol evaporate into vapor space 24 from the surfaces of solvents 32, 34, and 36 in compartments 26, 28, and 30, respectively. Alcohol from solvent 34 evaporates to form an alcohol-rich vapor in space 21 below a set of cooling coils 64. The rate of evaporation of liquid solvent into the vapor spaces 21 and 24, i.e., the degree to which volatilized fluorocarbon and alcohol are generated, is controlled by temperature regulation of the solvents in the compartments.

A condenser is disposed in vapor space 24 for condensing accumulated vapors in space 24 to form a condensate. The condenser comprises two sets of condensing coils, an upper set 62 and the lower set 64. Condensing coils 62 are disposed along the entire length of vapor space 24 and are supported on side walls 23. Condensing coils 62 include a temperature regulator 66, which is any suitably convenient temperature controller such as a thermostat or thermocouple. Temperature regulation of the condensing coils 62, 64 permits selective control of the composition of the condensate to be formed on the coils. The coils 62, 64 are positioned along the sidewalls so that the ratios between solvents, solvent vapors and free board comply with EPA standards known in the art.

Condensing coils 64 are arranged below coils 62, positioned between side walls 50, 52 of compartment 28. Coils 64 include a temperature regulator 68, which is any convenient temperature controller as described above for coils 62. Because coils 64 are positioned within compartment 28, coils 64 will preferentially condense susceptible vapors which accumulate within compartment 28. For example, if a cleaning process requires boiling pure alcohol, resulting in a high rate of evaporation of alcohol, the temperature of the condensing coils 64 may be selected to condense pure alcohol, i.e., above the boiling point of the fluorocarbon but below that of the alcohol. Alternatively, the accumulated vapors may contain, for example, alcohol, fluorocarbon and water, if an alcohol solution is used in compartment 28. The temperature of coils 64 may be selected to condense the mixture of the volatilized substances by means of regulator 68.

Fluorocarbon volatilized from solvents 32 and 36 accumulates above coils 64 within the remainder of vapor space 24. Volatilized fluorocarbon is nonflammable and provides a nonflammable vapor blanket over compartment 28 and about solvent 34, the alcohol. Vapors escaping from compartment 28 enter the nonflammable vapor blanket and mix with the nonflammable fluorocarbon vapors to form a gaseous mixture having substantially reduced tendencies toward flammability, ranging to nonflammability in most situations. The extent to which alcohol vapors accumulate and mix with fluorocarbon vapors in vapor space 24 can be controlled by regulating the temperature of the condensing coils 64. It has been found, however, that all volatilized alcohol from compartment 28 may be allowed to enter and mix with the fluorocarbon blanket, and still provide a nonflammable atmosphere in space 24 under many desirable circumstances. Although the vapors of boiling alcohol enter vapor space 24 at a much higher temperature than the fluorocarbon vapors because of the much higher boiling temperature of alcohol compared to fluorocarbon, the heat capacity of the fluorocarbon is sufficient to absorb the heat transferred by the hotter alcohol vapors and permit mixing of the vapors with minimal flammability potential. The combined vapors have a composition potential for forming alcohol-fluorocarbon azeotropes, many of which are known in the art. To maintain a low flammability potential, the vapor composition is usually maintained below a 50—50 mix by weight (50% or less alcohol). As used herein, the phrase "azeotropic potential" means a mixture of alcohol and fluorocarbon at or above a ratio of constituents to form an azeotrope or an admixture including an azeotrope.

Figure 3:
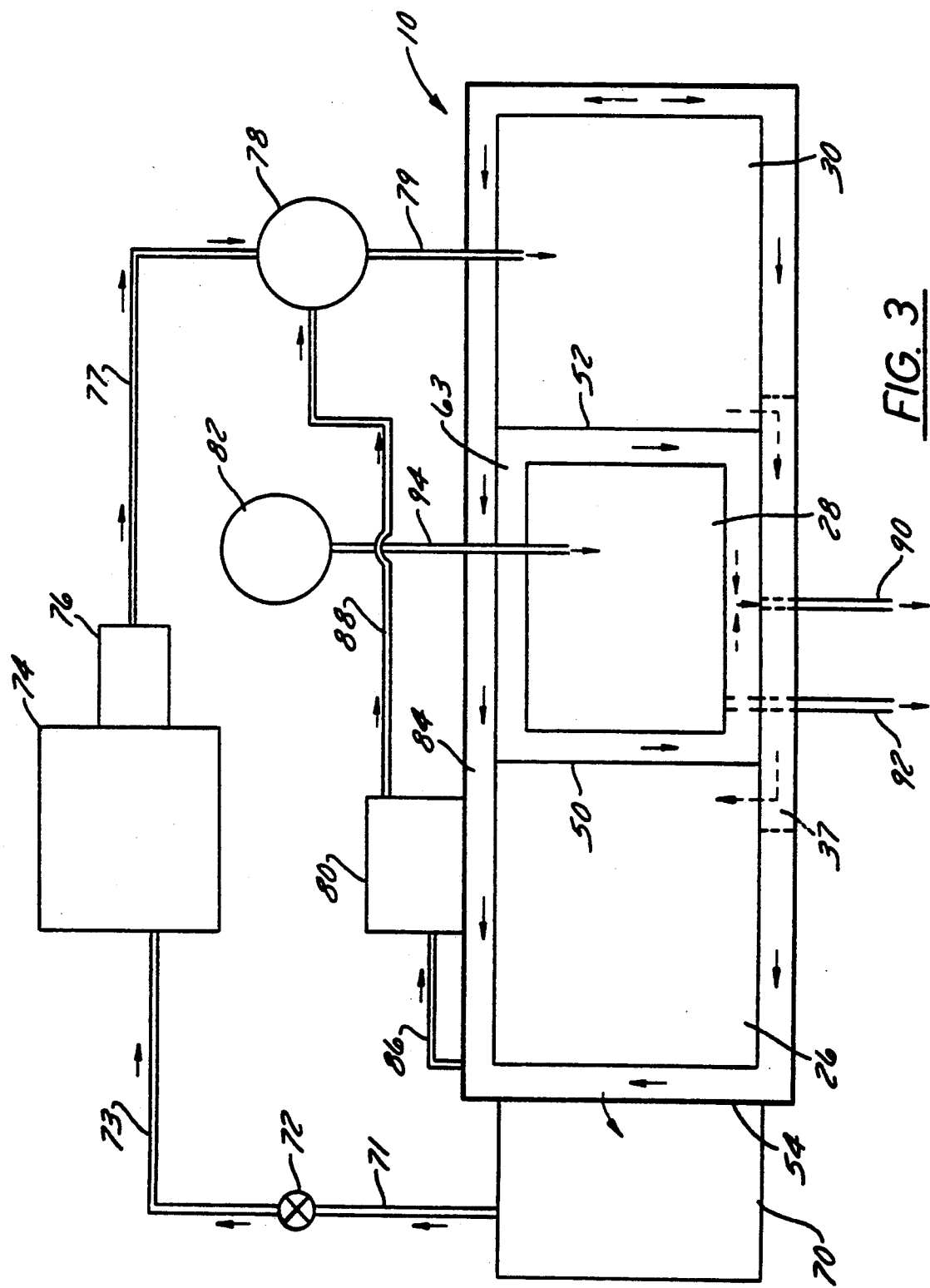
FIG. 3 is a schematic top view of an apparatus of the invention, illustrating the recovery and purification systems.

Referring now to FIGS. 1 and 3, apparatus 10 also preferably includes purification, recycling, and replenishing systems or fluid circuits for the fluorocarbon and alcohol. These circuits include a concentrator 70, wherein contaminants accumulate an optional pump 72, a still 74, an optional first water separator 76, and a water injector 78, a second water separator 80 and an alcohol reservoir 82. Purification and recycling of liquid fluorocarbon is provided by concentrator 70 which receives and concentrates contaminated liquid fluorocarbon alcohol solvent 32 from compartment 26.

As the fluorocarbon-alcohol accumulates in compartment 26, it spills over a partition wall 54 shorter than walls 50, 52 and into concentrator 70, wherein some of the contaminants settle to the bottom. Concentrator 70 has an outlet conduit 71 through which contaminated solvent is discharged from the concentrator via conduit 73 and pumped to still 74 by pump 72. The contaminated solvent is heated in still 74 and contaminants are removed.

Water separator 76 receives the distillate fluorocarbon, water and alcohol from still 74. In water separator 76, any water in the distillate is run off and the recovered solvents are discharged via conduit 77 into water injector 78. In water injector 78, the fluorocarbon can be separated from any alcohol. Because of the higher affinity of alcohol for water than for fluorocarbon, alcohol can be literally washed away from the fluorocarbon, i.e., the alcohol is water-extracted from the fluorocarbon. More than one extraction may be used if desired. The fluorocarbon is then discharged into compartment 30 via conduit 79 and reused. The alcohol is discharged into any convenient disposal system, e.g., it may be burned as a fuel or recycled to an alcohol reclaim system (not shown) and returned to compartment 28.

As illustrated in phantom in FIGS. 1 and 3, an overflow channel 37 connects compartment 30 to compartment 26, bypassing compartment 28. Overflow solvent in compartment 30 flows into compartment 26 and replenishes the liquid fluorocarbon of compartment 26.

Volatilized fluorocarbon, mixed with volatilized alcohol (and perhaps water from an alcohol and water solution) is preferably purified and recycled by collecting the condensate from coils 62 in, for example, a rectangular trough 84 disposed around the perimeter of chamber 20 beneath coils 62 or in any other convenient manner. A conduit 86 conducts the condensate to a water separator 80 which separates water from the other components of the condensate. The other components, fluorocarbon and alcohol, are then fed via a conduit 88 to water injector 78, in which, by water extraction, the alcohol is separated from the fluorocarbon in the same manner described above for the purification of liquid fluorocarbon.

The condensate from coils 64 is also collected in a square trough 63 in a manner similar to that described for the condensate of coils 62. The condensate is discharged via conduit 90 to any suitable disposal means where it is, for example, burned for fuel or recycled as described above. Reservoir 82 is connected to compartment 28 via conduit 94. Reservoir 82 contains fresh alcohol and is used to periodically or continuously replenish the liquid alcohol in compartment 28. Compartment 28 also has a drain conduit 92 for removal of spent alcohol.

While chamber 20 has been preferably described and shown as having three compartments in solvent domain 22, any number of compartments may be used provided that sufficient nonflammable fluorocarbon vapor is generated into space 24 to provide a nonflammable vapor blanket for the volatilized alcohol.

As used herein, the term "fluorocarbon" is meant to refer to the group of carbon compounds obtained by replacing the hydrogen atoms of hydrocarbons by one or more fluorine atoms, optionally including other halogen atoms. Such compounds include, for example, chlorofluorocarbons, perfluorocarbons, fluorohydrocarbons and chlorofluorohydrocarbons. According to the invention, chlorofluorocarbons, such as trichlorotrifluoroethane, cryofluorane, dichlorodifluoromethane, octafluorocyclobutane, perfluorocarbons such as carbon tetrafluoride, fluorohydrocarbons such as 1,1,2-trifluoroethane, and chlorofluorohydrocarbons, such as 2,2-dichloro-1,1,1-trifluoroethane, are suitable solvents for degreasing and the like, that is, as solvents 32 (and 36). In addition, solvent blends such as chlorofluorocarbon-alcohol azeotropes, of which several are known and commercially available, and other halocarbons, such as trichloromethane, are also suitable. Lower alkyl alcohols, such as methanol, ethanol, propanol, isopropanol, and butanols, are suitable polar solvents, although isopropanol is widely used in cleaning systems of the type described herein and is thus preferred.

The alcohol in compartment 28 may be substantially pure, or may comprise a mixture of alcohol and another solvent, such as a fluorocarbon or water. Other flammable solvents such as terpenes may also be used. Similarly, other nonflammable liquids with boiling points, vapor pressures and heat capacities similar to chlorofluorocarbons may be used as the nonflammable solvent.

In the cleaning operation, articles to be cleaned are conveyed from compartment to compartment in sequential manner by any suitable conveying means known to those skilled in the art, such as a belt conveyer that transports the articles through each of the solvents. The conveyor can enter chamber 20 through its open upper end 25, or the opening may be positioned elsewhere. In the latter case, coils 62 would be repositioned to be near the opening. An enclosure (not shown) surrounding the conveyor and chamber 20 may be provided to prevent escape of fugitive vapors.

The solvents generally are maintained at boiling temperatures during the cleaning process, although other temperatures may be selected depending on the material and properties of the articles to be cleaned. The articles are first placed in compartment 26 in which most oil or grease-type contaminants are removed as well as a large portion of any water contaminant from the physical action of the boiling solvent. Compartment 26 will typically contain 90% of the contaminants from the articles to be cleaned. After a suitable time, the articles are moved to compartment 28 where water and other polar or resinous contaminants are removed by the alcohol. Finally, the articles are moved to compartment 30 which ensures that traces of alcohol are removed. More than one washing may be performed if desired, but the sequential treatment in accordance with the invention should normally produce acceptable cleaning.

The nonflammable vapor blanket provided in accordance with the invention affords the advantage using the high concentrations of alcohol which are often required for certain contaminants. The purification and recovery of both liquid and vapor fluorocarbon in accordance with the invention allows use of fluorocarbon solvents, and the fluorocarbon is effectively recycled, reducing loss of ozone-depleting fluorocarbons to the environment.

While the invention has now been disclosed with reference to certain preferred embodiments and exemplified with regard thereto, those skilled in the art will appreciate the various substitutions, modifications, omissions and changes that may be made without departing from the spirit thereof as expressed in the appended claims. For example, the system of the invention also can be used for surface treatment, for example, wherein the alcohol contains a surfactant which is deposited on (rather than removed from) the surface of the article. Glycerine may be coated on dialyzer fibers in the alcohol chamber for purposes well known in the art. These and other modifications may be made without departing from the invention as expressed in the appended claims.

We claim:

1. A method for maintaining a flammable solvent in a nonflammable environment, comprising:

maintaining a supply of a non-flammable solvent consisting essentially of a fluorocarbon in a first compartment of an enclosure at a temperature in the range of from ambient to boiling;

maintaining a supply of a flammable solvent consisting essentially of a lower alcohol in a second compartment of the enclosure at a temperature in the range of from ambient to boiling, wherein the nonflammable solvent is disposed separately from the flammable solvent so that the respective vapors volatize from the open upper surface of each solvent, the first and second compartments opening onto a common upper space in which vapors from the flammable and nonflammable solvents mix and form a vapor blanket; and limiting the amount of volatized flammable solvent which enters the common upper space from the second compartment so that the vapor blanket remains non-flammable, while maintaining the non-flammable solvent at a temperature sufficiently high to produce enough non-flammable vapor to maintain the vapor blanket in a non-flammable state.

2. The method of claim 1, wherein the limiting step further comprises confining to the second compartment a vapor more rich in the flammable solvent than the gaseous mixture forming the vapor blanket, so that the non-flammable vapor blanket overlies the vapor rich in the flammable solvent.

3. The method of claim 2, wherein the limiting step further comprises condensing the vapor rich in the flammable solvent using a condenser disposed in the second compartment near the common upper space.

4. The method of claim 3, wherein the enclosure has an opening allowing access to the common upper space, and further comprising a step of limiting the amount of volatized solvent in the vapor blanket which escapes the common upper space through the access opening.

5. The method of claim 4, wherein the step of limiting escape of vapor blanket solvent further comprises condensing vapor from the vapor blanket using a condenser disposed in the common upper space near the access opening, thereby substantially retaining the vapor blanket within the enclosure.

6. The method of claim 3, further comprising removing condensed flammable solvent from the enclosure.

7. The method of claim 1, further comprising the step of boiling the non-flammable solvent within the first compartment.

8. The method of claim 1, further comprising the step of boiling the flammable solvent within the second compartment.

9. The method of claim 8, further comprising the step of boiling the non-flammable solvent within the first compartment.

10. The method of claim 1, wherein the vapor blanket composition is maintained at 50% or less by weight of the lower alcohol.

11. The method of claim 1, wherein the non-flammable solvent consists essentially of the fluorocarbon and up to an azeotropic amount of an alcohol, the flammable solvent consists essentially of the lower alcohol, and the vapor blanket composition has an azeotropic potential.

12. The method of claim 1, wherein the non-flammable solvent consists essentially of a chlorofluorocarbon and up to an azeotropic amount of isopropanol, and the flammable solvent consists essentially of isopropanol.

13. The method of claim 1, wherein the enclosure has an opening allowing access to the common upper space, and further comprising the steps of:
limiting the amount of volatilized solvent in the vapor blanket which escapes the common upper space through the access opening by condensing vapor from the vapor blanket using a condenser disposed in the common upper space near the access opening, thereby substantially retaining the vapor blanket within the enclosure;
collecting condensed mixture from the condenser disposed near the access opening;
removing the condensed mixture from the enclosure;
purifying the condensed mixture; and then
recycling purified fluorocarbon from the condensed mixture to the first compartment.

14. The method of claim 13, wherein the non-flammable solvent consists essentially of the fluorocarbon and up to an azeotropic amount of an alcohol, the flammable solvent consists essentially of the lower alcohol, and the purifying step further comprises separating alcohol and water from fluorocarbon.

15. The method of claim 13, wherein the enclosure has a pair of spaced partition walls subdividing a lower portion of the enclosure into first, second and third compartments each for separately containing a supply of solvent, which compartments open onto the common upper space, and further comprising:
maintaining a further supply of a non-flammable solvent in the third compartment of the enclosure at a temperature in the range of from ambient to boiling;
allowing excess non-flammable solvent in the first compartment to overflow into the third compartment;
purifying non-flammable solvent from the third compartment; and
recycling the purified non-flammable solvent from the third compartment to the first compartment.

16. The method of claim 1, wherein the enclosure has a pair of spaced partition walls subdividing a lower portion of the enclosure into first, second and third compartments each for separately containing a supply of solvent, which compartments open onto the common upper space, and further comprising:
maintaining a further supply of a non-flammable solvent in the third compartment of the enclosure at a temperature in the range of from ambient to boiling;
allowing excess non-flammable solvent in the first compartment to overflow into the third compartment;
purifying non-flammable solvent from the third compartment; and
recycling the purified non-flammable solvent from the third compartment to the first compartment.

17. The method of claim 16, wherein the non-flammable solvent consists essentially of the fluorocarbon and up to an azeotropic amount of an alcohol, and the flammable solvent consists essentially of the lower alcohol, and the steps of purifying and recycling the non-flammable solvent from the third compartment further comprise:
removing water from the non-flammable solvent;
extracting alcohol from the non-flammable solvent, leaving fluorocarbon; and
then feeding remaining fluorocarbon to the first compartment.

18. The method of claim 17, wherein the step of purifying the non-flammable solvent from the third compartment further comprises distilling the non-flammable solvent prior to removing water therefrom.

19. The method of claim 17, wherein the step of purifying the non-flammable solvent from the third compartment further comprises concentrating the non-flammable solvent from the third compartment in a concentrator wherein contaminants settle to the bottom of the concentrator.

* * * * *